(12) United States Patent  
Chen et al.

(10) Patent No.: US 8,106,480 B2
(45) Date of Patent: Jan. 31, 2012

(54) BIPOLAR DEVICE HAVING IMPROVED CAPACITANCE

(75) Inventors: Alan S. Chen, Windermere, FL (US); Mark Dyson, Singapore (SG); Daniel C. Kerr, Oak Ridge, NC (US); Nace M. Rossi, Singapore (SG)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/652,560

(22) Filed: Jan. 5, 2010

(65) Prior Publication Data

US 2010/0102418 A1 Apr. 29, 2010

Related U.S. Application Data

(62) Division of application No. 11/531,477, filed on Sep. 13, 2006, now Pat. No. 7,666,750.

(51) Int. Cl.
*H01L 29/73* (2006.01)
*H01L 29/732* (2006.01)
*H01L 21/70* (2006.01)
*H01L 21/761* (2006.01)

(52) U.S. Cl. ............... 257/552; 257/E29.174; 257/590; 257/548; 257/549

(58) Field of Classification Search .................. 257/548, 257/549, 552, 590, E29.174
See application file for complete search history.

(56) References Cited

U.S. PATENT DOCUMENTS

| | | | |
|---|---|---|---|
| 3,766,446 A | 10/1973 | Tarui et al. | |
| 4,485,552 A | 12/1984 | Magdo et al. | |
| 5,302,534 A | 4/1994 | Monk et al. | |
| 5,394,007 A | 2/1995 | Reuss et al. | |
| 5,677,209 A | 10/1997 | Shon et al. | |
| 5,889,325 A | 3/1999 | Uchida et al. | |
| 5,899,714 A | 5/1999 | Farrenkopf et al. | |
| 6,144,077 A | 11/2000 | Maki | |
| 6,359,317 B1 * | 3/2002 | Carroll et al. | 257/370 |
| 6,670,658 B2 | 12/2003 | Hattori et al. | |
| 6,794,730 B2 | 9/2004 | Kim et al. | |
| 6,815,801 B2 | 11/2004 | Romas et al. | |
| 6,943,426 B2 | 9/2005 | Williams et al. | |
| 7,304,354 B2 | 12/2007 | Morris | |
| 2001/0026977 A1 | 10/2001 | Hattori et al. | |
| 2002/0084495 A1 | 7/2002 | Kim et al. | |
| 2006/0223257 A1 | 10/2006 | Williams et al. | |
| 2006/0246652 A1 | 11/2006 | Grivna et al. | |
| 2008/0064177 A1 | 3/2008 | Chen et al. | |
| 2008/0251882 A1 | 10/2008 | Koide | |
| 2010/0102418 A1 * | 4/2010 | Chen et al. | 257/552 |

* cited by examiner

*Primary Examiner* — Mary Wilczewski

(57) ABSTRACT

The invention, in one aspect, provides a semiconductor device that comprises a collector located in a semiconductor substrate and an isolation region located under the collector, wherein a peak dopant concentration of the isolation region is separated from a peak dopant concentration of the collector that ranges from about 0.9 microns to about 2.0 microns.

8 Claims, 9 Drawing Sheets

BIPOLAR DEVICE HAVING IMPROVED CAPACITANCE

CROSS-REFERENCE TO RELATED APPLICATIONS

This application is a Divisional of U.S. application Ser. No. 11/531,477 filed on Sep. 13, 2006 now U.S. Pat. No. 7,66,750, to Alan S. Chen, et al., entitled "BIPOLAR DEVICE HAVING IMPROVED CAPACITANCE, and commonly assigned with the present invention and incorporated herein by reference.

TECHNICAL FIELD OF THE INVENTION

The invention is directed, in general, to a method of manufacturing a semiconductor device and, more specifically, to a bipolar device having improved capacitance and a method of manufacture therefore.

BACKGROUND OF THE INVENTION

Optimization of semiconductor devices continues to be an important goal for the semiconductor industry. The continued miniaturization of semiconductor devices, such as bipolar transistors, presents ongoing challenges to semiconductor manufacturers in maintaining or improving that optimization while minimizing production time and costs. One such challenge resides in the capacitance associated with vertical PNP (VPNP) bipolar transistors that is present due to an isolation region lying under the collector. This capacitance is undesirable because it can adversely affect device speed and overall device performance. Moreover, it has a greater impact as device sizes continue to shrink.

Often, VPNP bipolar transistors are built on a p-type substrate, and the p-type collector of the VPNP is typically isolated from the substrate. One way in which the collector is isolated from the substrate is by an isolation region, often referred to as silicon on insulator (SOI). In some designs, instead of using a bulk silicon wafer, a thin (between 1 and 10 microns) layer of silicon is formed on top of a buried oxide layer. The devices are then created in this top layer. The collector is isolated from the p-substrate by the buried oxide layer on the bottom, and by deep trench isolation on both sides. Unfortunately, this method does not fully address the capacitance issues and is costly as the initial substrates can cost more than double the cost of single bulk silicon wafers. Additionally, the deep trench process requires at least one mask, with several etch steps, a trench fill and one chemical/mechanical polishing (CMP) step.

Another isolation region that is present in VPNP transistors is an n doped isolation region (NISO), which is often used to isolate the collector. The NISO region is typically fabricated by implanting an n-type junction under the collector and is connected to n-doped tubs by adjacent isolation tubs. However, the presence of this NISO region introduces a significant collector-n-isolation capacitance (Ccs), which can adversely affect device speed and performance.

Accordingly, there is a need to provide a process and device by which capacitance can be reduced in a VPNP bipolar transistor without significant productions costs or production time.

SUMMARY

To address the above-discussed deficiencies, the invention provides a semiconductor device. In this embodiment, the semiconductor device comprises a collector located in a semiconductor substrate and an isolation region located under the collector, wherein a peak dopant concentration of the isolation region is separated from a peak dopant concentration of the collector by a distance that ranges from about 0.9 microns to about 2.0 microns.

The foregoing has outlined one embodiment of the invention so that those skilled in the art may better understand the detailed description of the invention that follows. Additional embodiments and features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
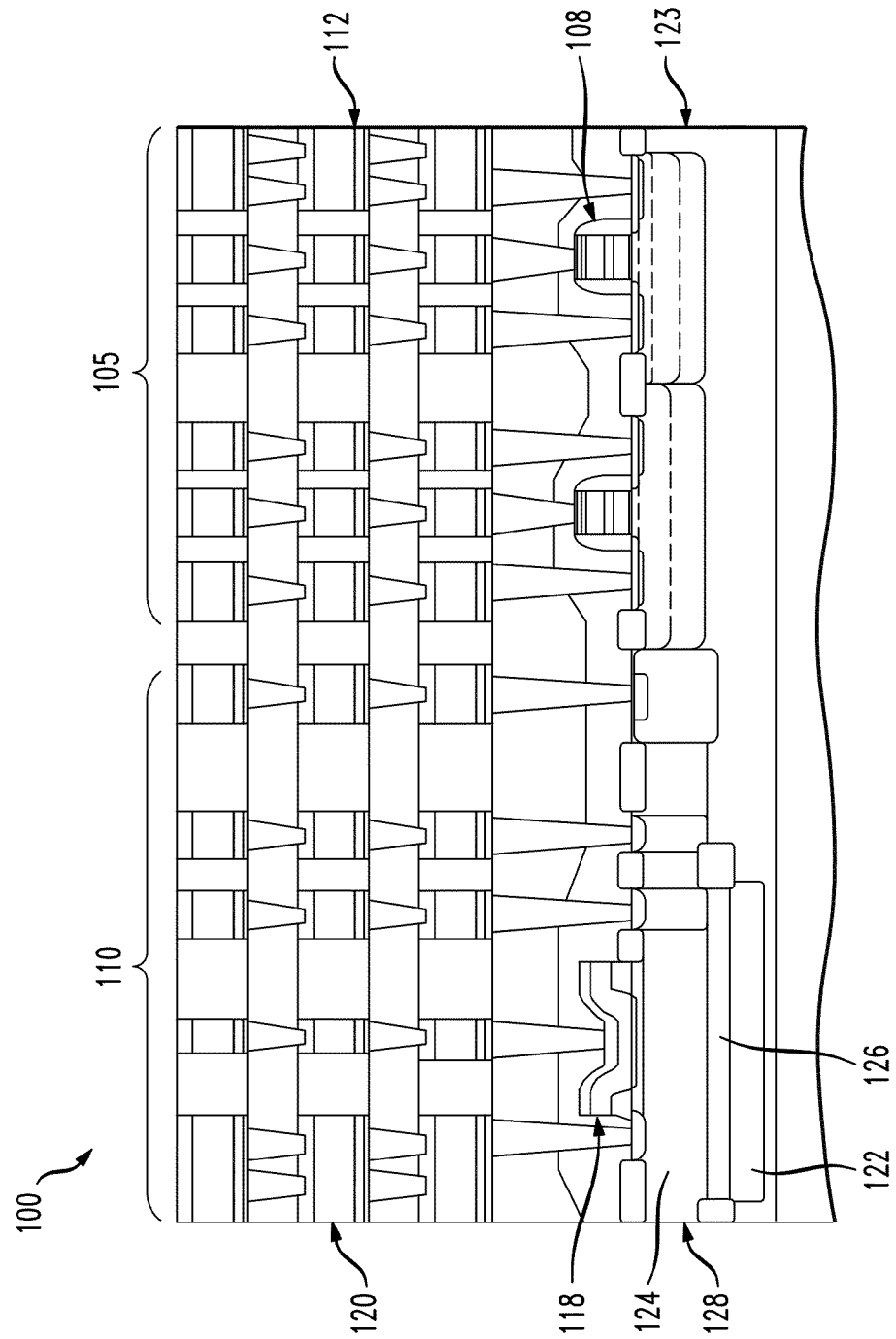
FIG. 1 illustrates a semiconductor device as provided by one embodiment of the invention.

Referring initially to FIG. 1, there is illustrated a general, partial view of a semiconductor device 100 as provided by the invention. In this embodiment, the semiconductor device 100 includes a transistor region 105 comprising non-bipolar transistors 108 (e.g., gates electrodes or other active devices that are not configured as bipolar devices), such as PMOS or NMOS transistors, and interconnects 112. The transistor region 105 may be of conventional design and manufactured with conventional processes and materials known to those skilled in the art. In the illustrated embodiment, the transistors 108 are configured as a complementary CMOS device.

The semiconductor device 100 further includes a bipolar transistor region 110. The region 110 includes bipolar transistors 118 as provided by the invention, such as a vertical PNP bipolar transistor, and interconnects 120 that may be fabricated using conventional processes and materials. It should be noted that while separately designated for purposes of pointing to different areas of the device 100, interconnects 112 and 120 can be fabricated simultaneously and with the same deposition processes and materials. In addition, however, and unlike conventional devices, the bipolar transistor 118 further comprises an isolation region 122 that is separated from a collector 124 by a depletion area 126. As discussed below, the separation of the isolation region 122 may be accomplished in a number of ways. For example, a separate mask may be used to allow the isolation region 122 to be driven deeper into the semiconductor substrate 122. Alternatively, a conventional mask may be used and higher implant energy may be used to drive the isolation region 122 deeper into substrate 123. The substrate 123 may be a conventional substrate, such as a conventional epitaxial (epi) layer or a doped region of a semiconductor wafer. The wafer or epitaxial layer may be any number of semiconductor substrate types, such as doped silicon, silicon germanium, gallium arsenide, or indium. Due to the width that separates the isolation region 122 and the collector 124, the capacitance typically found between these two structures is reduced. This in turn provides a device having greater speed and better overall performance.

The invention recognizes that by separating the isolation region from the collector by greater distances than those found in conventional devices, the capacitance associated with these two structures can be beneficially reduced. Moreover, because the methods discussed herein are relatively simple from a processing standpoint, the stated advantages can be achieved without significant additional processing steps or cost. Thus, enhanced device performance can be achieved in a cost effective manner.

Figure 2:
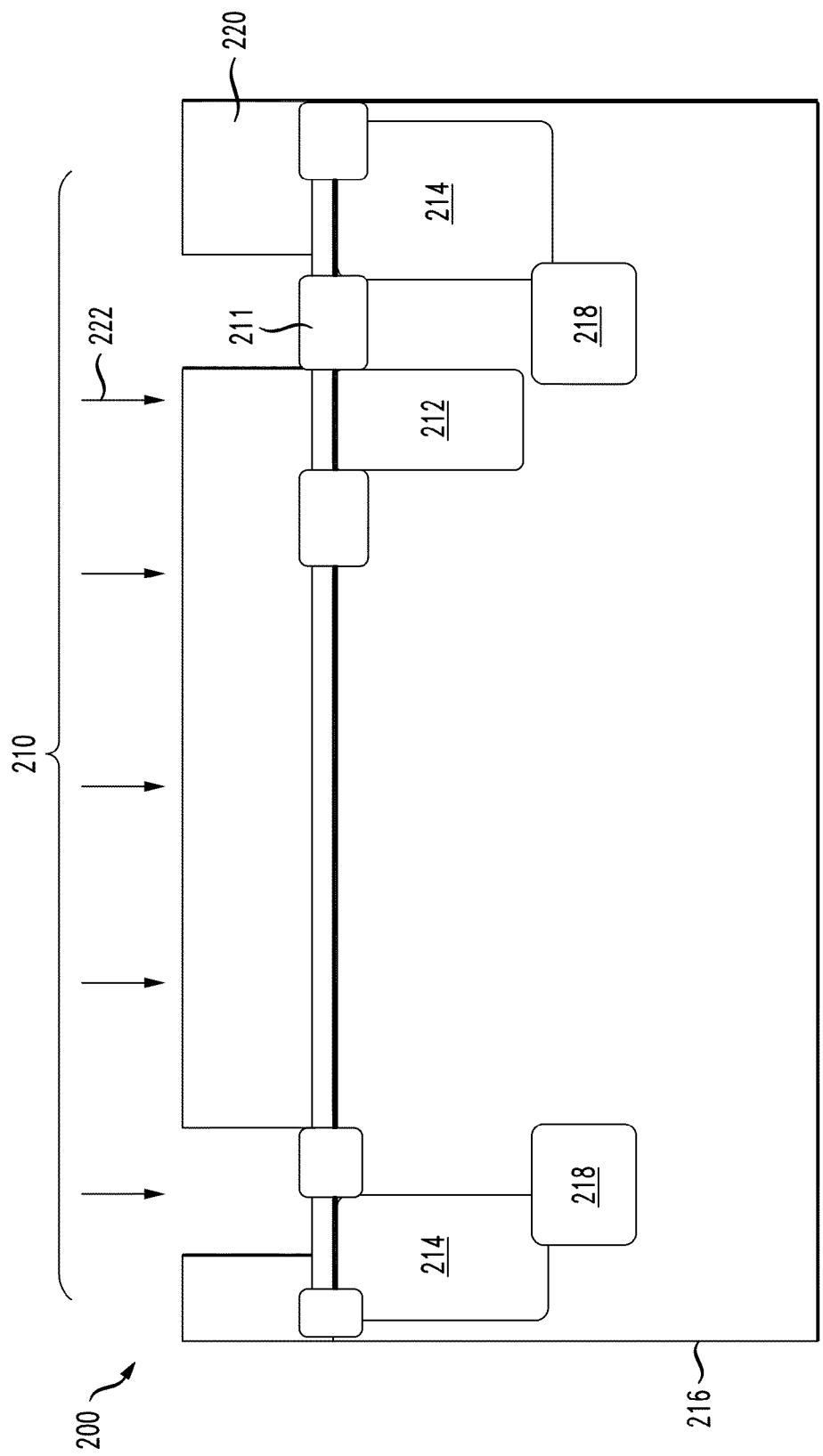
FIGS. 2-4 illustrate views of one embodiment of a semiconductor device during various stages of fabrication wherein the isolation region is formed with a different mask than the isolation tubs.

FIG. 2 illustrates a partial view of one embodiment of a semiconductor device 200 provided by the present invention and at an early stage of manufacture. In this view, there is illustrated a bipolar transistor region 210; the previously mentioned non-bipolar transistor region, which may also be present, is not shown here for brevity. However, several steps, which may be conventional in constructing the non-bipolar transistors, may have occurred at this point. For instance, isolation structures 211, as those shown in the bipolar region, may have been formed at this point along with NMOS and PMOS tub implants. During the formation of the NMOS and PMOS tub implants, P tub 212, and N tubs 214 may also be conventionally formed in the bipolar region 210. In describing certain embodiments of the invention, particular dopant schemes may be discussed. However, it should be understood that these dopant schemes are examples only, and other schemes may be used in other embodiments of the invention. The region 210, as well as the non-bipolar region, when present, is formed over a semiconductor substrate 216, such as a conventional epitaxial (epi) layer or a doped layer of a semiconductor wafer. The wafer or epitaxial layer may be any number of semiconductor substrate types, such as doped silicon, silicon germanium, gallium arsenide, or indium.

Moreover, as well known, the substrate 216 is doped with an initial doping concentration, which in essence forms a background doping concentration in the substrate 216. Depending on the device, the type of dopant and its concentration in the substrate 216 depends on the intended design of the device. In the illustrated embodiment, the background dopant of the substrate 216 may be p-type.

In the illustrated embodiment, isolation tubs 218 have been formed. In this particular embodiment, the isolation tubs 218 are formed separately from the isolation region 122 (FIG. 1) by using separate masks. This provides better process control over the formation of the isolation tubs 218 and the isolation region 122. A mask having the appropriate layout may be used to conventionally deposit and pattern a photoresist layer 220 as shown. An implant 222 may then be conducted through the openings in the photoresist layer 220 to form the isolation tubs 218. The isolation tubs 218 provide connectivity between the N tubs 214 and the isolation region 122 (FIG. 1) and together they electrically isolate the collector 124 (FIG. 1). In this embodiment, conventional processes may be used to form the isolation tubs 218. For example, the isolation tubs 218 may be implanted with an n-type dopant at a dosage ranging from about 4E12 atoms/cm$^2$ to about 2E13 atoms/cm$^2$ and at an implant energy that ranges from about 1.0 MeV to about 2.0 MeV. In a more specific embodiment, the isolation tubs 218 may be formed with a doping dosage of about 6E12 atoms/cm$^2$ and at an implant energy of about 2.0 MeV. It should be noted that while the above discussion states that the isolation tubs 218 are formed prior to the isolation region, other embodiments provide that the isolation tubs 218 may be formed after the isolation region is formed.

In other embodiments were the isolation region 122 (FIG. 1) needs to be driven exceptionally deep to achieve the desired reduction in capacitance, the way in which the isolation tubs 218 are implanted may be adjusted to insure connectivity with both the N-tubs 214 and the deeper isolation region. In such embodiments, the isolation tubs 218 may be implanted in such a way as to form more graded structures (i.e., one where the dopant is sufficiently spread out such that the connectivity is maintained). For example, the isolation tubs 218 may be first implanted with a dopant at a first dosage ranging from about 4E12 atoms/cm$^2$ to about 2E13 atoms/cm$^2$ and at a energy ranging from about 1 MeV to about 2 MeV, and then implanted with second implant dosage ranging from about 4E12 atoms/cm$^2$ to about 2E13 atoms/cm$^2$ and at a energy ranging from about 2 MeV to about 3 MeV. The higher energies drive the dopants in further, yet achieve connectivity with both the N-tubs 214 and the isolation region 122 (FIG. 1).

Once implanted, the isolation tub 218 has a peak dopant concentration. As used herein, peak dopant concentration is the region within the given structure where the average concentration within that region is the greatest. For example in one embodiment, the peak dopant concentration may range from about 5E16 atoms/cm$^3$ to about 2E17 atoms/cm$^3$ and may occur at depths (as measured from the surface of the substrate 216) ranging from about 1.25 microns to about 1.75 microns. However, the peak dopant concentration and its position within the substrate may vary in different embodiments, depending on the design of the device. Well known techniques, such as SIMS profiling can be used to determine the peak dopant concentration of such doped regions and can be used to determine the depth at which the peak dopant concentration generally occurs. Moreover, as understood by those who are familiar with SIMS profiling, the peak dopant concentration may not be a sharp peak but may be a flatter peak. In such instances, the peak dopant concentration may be found over a boarder range of averaged values.

Figure 3:
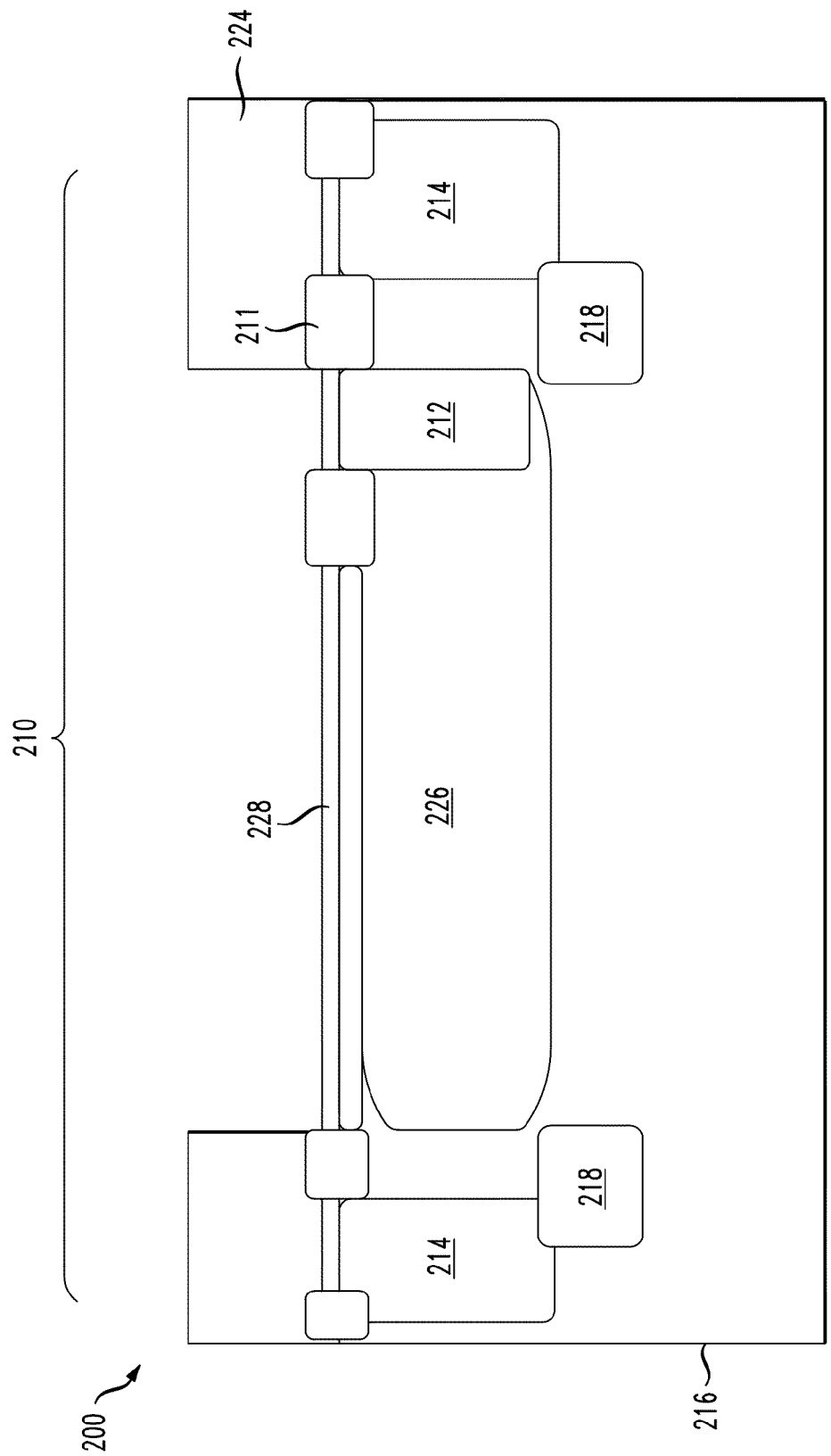

Following the formation of the isolation tubs 218, the photoresist layer 220 is removed using conventional processes. A second mask is then used to pattern a photoresist layer 224 as seen in FIG. 3. Different implants are used to form a collector 226 and base 228.

The collector 226 and base 228 may be implanted using the same mask or patterned photoresist 224. Conventional implant steps and doping concentrations may be used to form the collector 226 and the base 228. For example, in forming the collector 226, a p-type dopant, such as boron, may be used and may be implanted at a concentration of about 2E14 atoms/cm$^2$ and at an implant energy of about 350 keV. Once implanted, the collector 226 has a peak dopant concentration. In one embodiment, the peak dopant concentration may be about 1E19 atoms/cm$^3$ and may occur at a depth about 0.8 microns as measured from the surface of the substrate 216. The separation of the peak dopant concentrations between the collector 226 and the isolation tub 218 will vary depending on how deeply the collector 226 and the tub 218 are respectively driven. For example, the separation between the peak dopant concentration of the collector 226 and the isolation tub 218 may range from about 0.2 microns to about 0.8 microns.

In a PNP bipolar structure, the base 228 may be implanted with an n-type dopant, such as arsenic or phosphorous. Reverse dopant schemes, of course, are also within the scope of the invention. Following the formation of the collector 226, conventional implant energies and concentrations may be used to form the base 228 in the collector 226.

Figure 4:
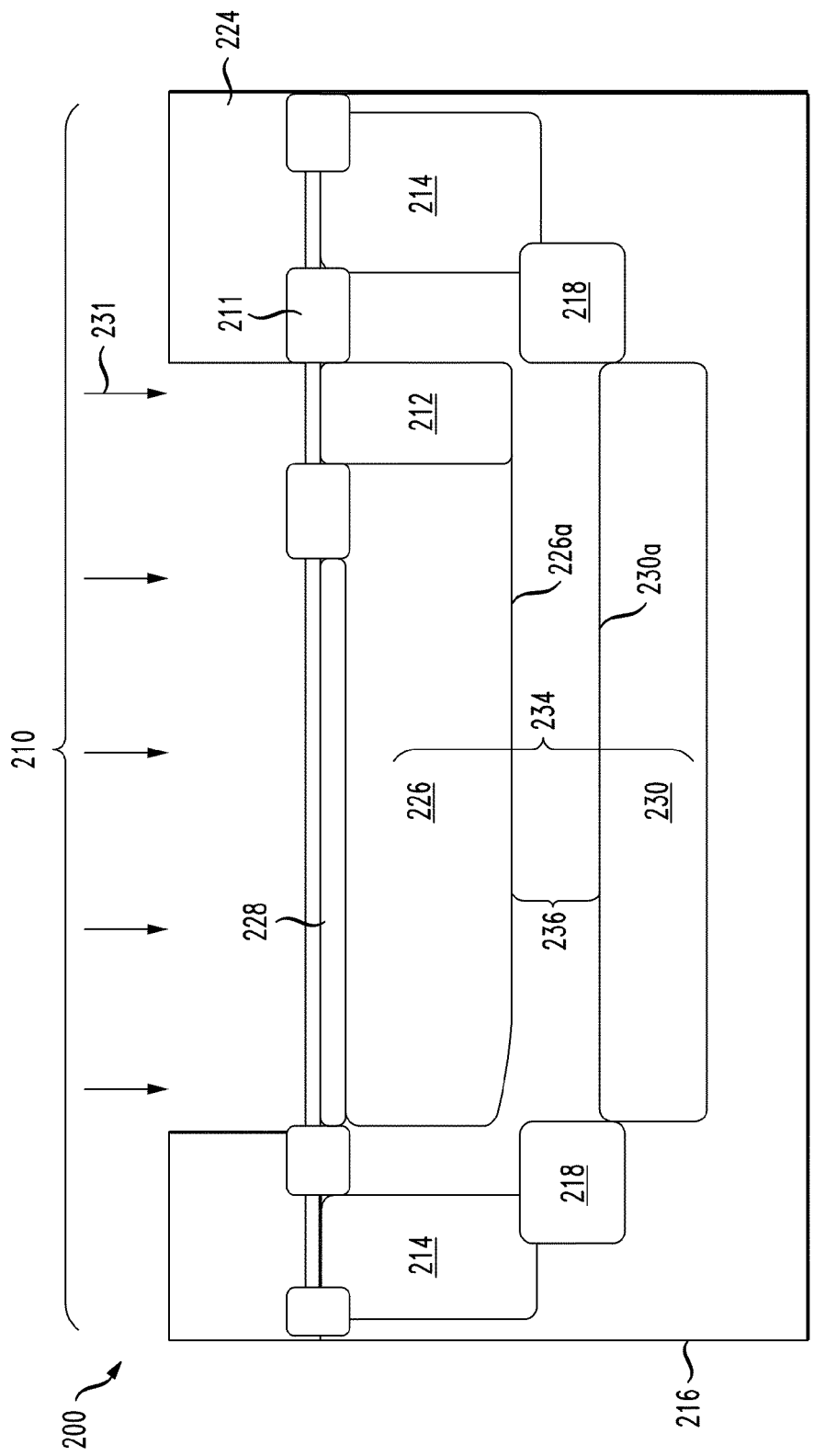

In the embodiment illustrated in FIG. 4, the same patterned photoresist layer 224 may be used to form an isolation region 230. Since, the isolation region 230 electrically isolates the collector 226, its dopant type will be opposite from that used to dope the collector 226. For example, in one embodiment, where the collector is doped with boron, a phosphorous implant 231 may be used to form the isolation region 230. The dosage of the dopant used to form the isolation region 230 may range from about 4E12 atoms/cm$^2$ to about 8E12 atoms/cm$^2$ and at an implant energy ranging from about 2.0 MeV to about 4.0 MeV. In a more specific embodiment, the isolation region 230 may be formed using a doping dosage of about 6E12 atoms/cm$^2$ and at implant energy of about 3.2 MeV. Once implanted, the isolation region 230 has a peak dopant concentration. In one embodiment, the peak dopant concentration may range from about 5E17 atoms/cm$^3$ to about 2E17 atoms/cm$^3$. However, it should be noted that the peak dopant concentration may vary in different embodiments, depending on the design of the device. The implant energy that is used should be sufficient to drive the isolation region 230 substantially past the collector 226, as described below, but should not be driven so far that connectivity with the isolation tub 218 is lost. In this embodiment, the isolation region 230 is located slightly below the isolation tub 218, as determined from the centers of the peak dopant concentrations in each structure. The depth of each of these structures may be determined by measuring the distance from the surface of the substrate 216 to the center of the peak dopant concentration associated with each structure.

The separation or distance 234 between the peak dopant concentrations of the collector 226 and the isolation region 230 will vary depending on how deeply the collector 226 and the tub 230 are respectively driven. For example, the separation between the peak dopant concentration of the collector 226 and the isolation region 230 may range from about 0.9 microns to about 2.0 microns.

When implant 231 is conducted to the appropriate depth, a depletion region 232 within the semiconductor substrate 216 is formed. The depletion region has a width 236 as measured from a depletion edge 226a of collector 226 to depletion edge 230a of the isolation region 230 and has a width 236 as measured from a depletion edge 226a to depletion 218a of the isolation tub 218. As used herein, depletion edge includes those regions that are at or near the depletion edge. The depletion region 232 is the equilibrium (no applied field) region that supports a voltage. Outside the depletion region 232, mobile carriers balance lattice ions, so there is no net voltage. Inside the depletion region 232 carriers do not match lattice ions, which forms a junction voltage. The edge of depletion region 232 is where the junction voltage is substantially zero. Thus, in the illustrated embodiment of FIG. 4, the depletion edges 226a and 230a respectively occur where the junction voltage is substantially zero. Those who are skilled in the art understand how to determine the distance of depletion edges of implanted structures using simulation software where process parameters are known. Further, it will be appreciated by those who are skilled in the art that in other embodiments, the distance may be determined from a point at or near the depletion edge of the collector to at or near the depletion edge of the isolation region.

While the width 236 may vary depending on device size and design, in one embodiment, width 236 should be at least about 0.2 microns, and in another embodiment, will range from about 0.2 microns to about 1 microns. In these embodiments, these distances reduce the capacitance between collector 226 and the isolation region 230, while maintaining the connectivity between the N tubs 214, the isolation tubs 218, and the isolation region 230. However, it should be understood that other distances are also within the scope of the invention and will depend on design parameters of each device. Though the above-described embodiment discusses that the collector 226 is formed before the isolation region 230, it should be understood that the isolation region 230 may be formed before the collector.

Figure 5:
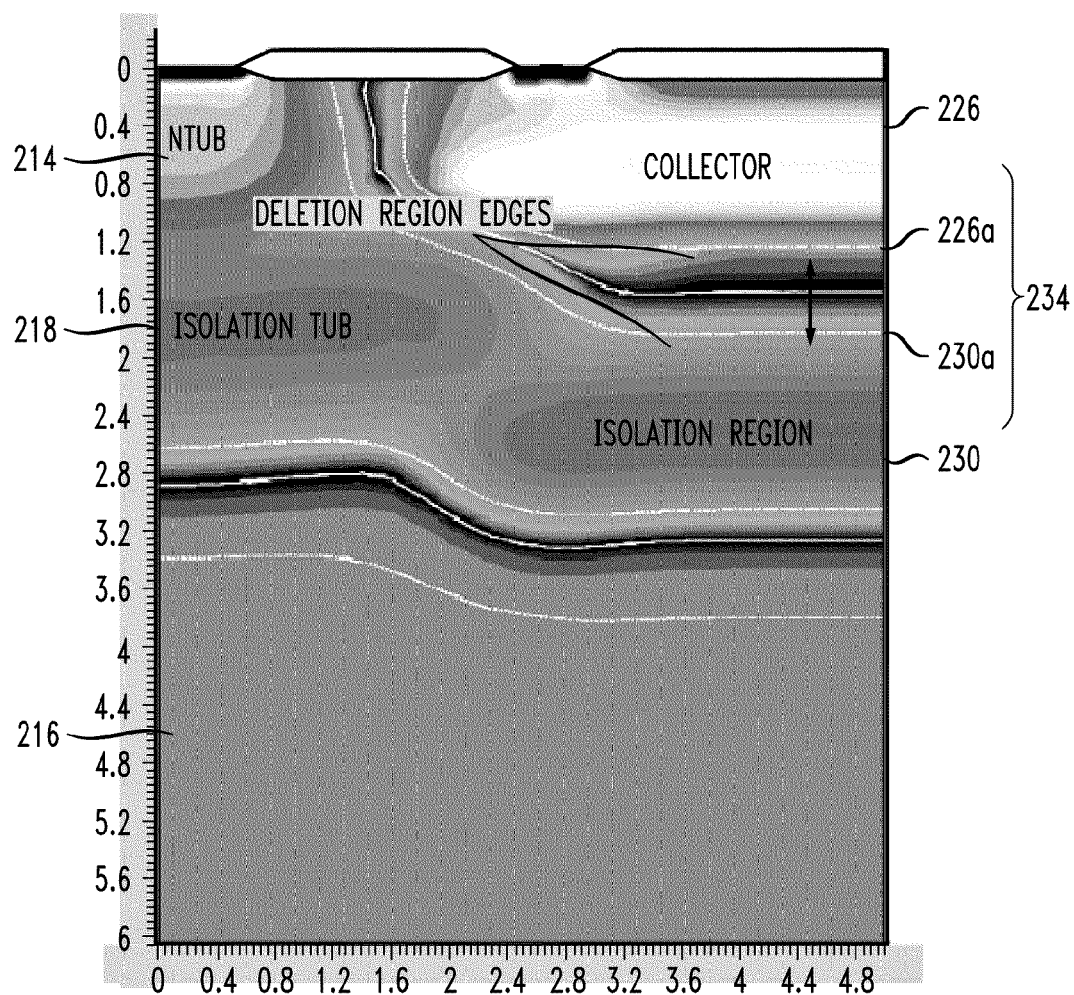
FIG. 5 illustrates a simulation of the doping profiles and concentrations of one embodiment of FIG. 4.

The separation or distance 234 between the peak dopant concentrations of the collector 226 and the isolation region 230 and the separation between the depletion edges 226a and 230a are further illustrated in FIG. 5, which is a cross-section (using well known simulation software) of one embodiment of the invention. As seen in FIG. 5, the isolation region 230 is separated from the collector 226, as determined from their peak dopant concentrations, by about 2.0 microns and is separated from the collector 226, as determined by their depletion edges, by about 0.6 microns. In the illustrated embodiment of FIG. 5, the amount of separation between the collector 226 and the isolation tub 218 is significantly less than the separation between the collector 226 and the isolation region 230. The overlap between the N tub 214, the isolation tub 218, and the isolation region 230 that provides the electrical connectivity between these structures is also seen in FIG. 5.

Figure 6:
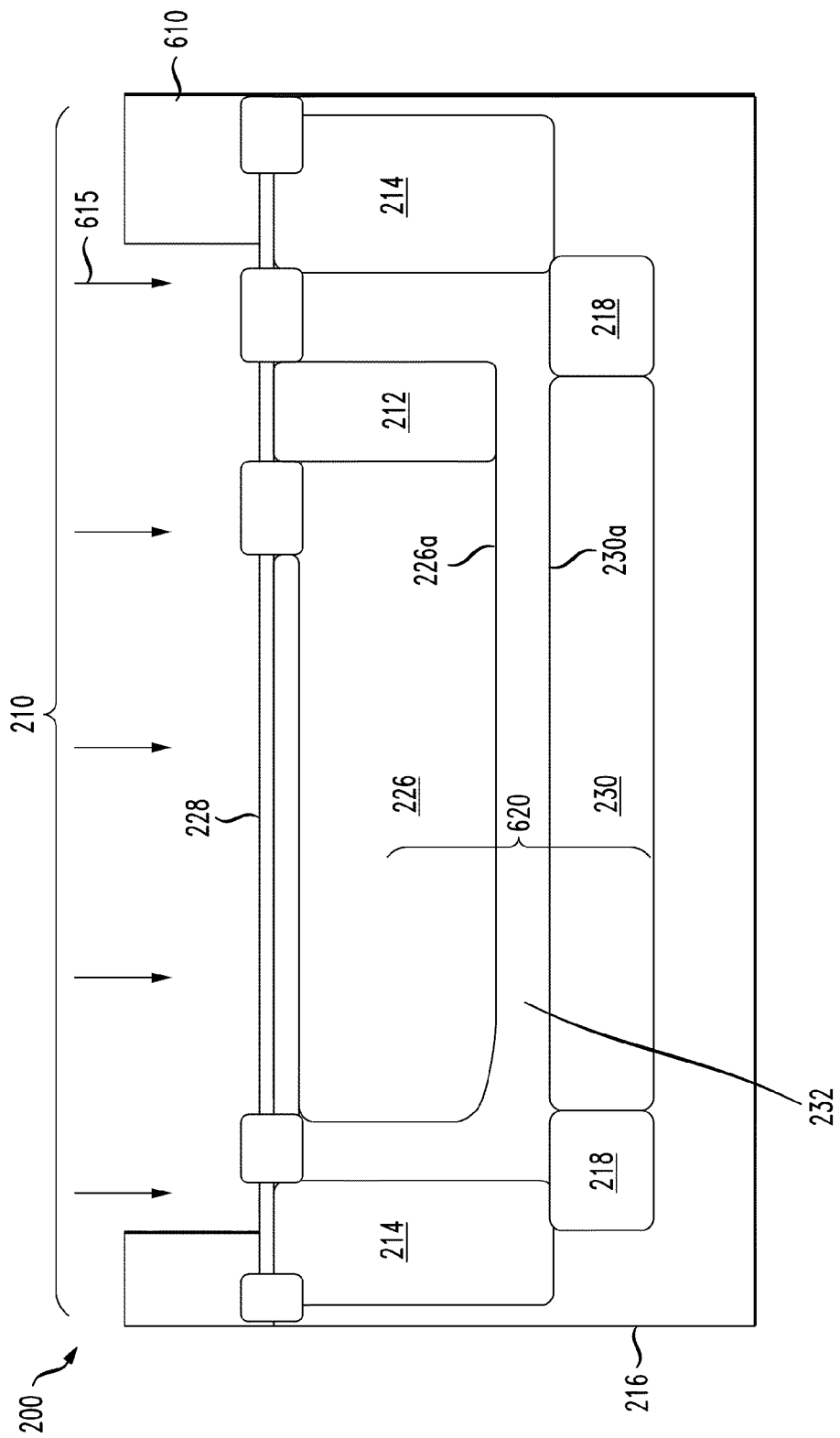
FIG. 6 illustrates an alternative embodiment where the isolation region and isolation tubs are concurrently implanted.

FIG. 6 illustrates another embodiment of the invention. For purposes of discussion of FIG. 6, where the structures are similar to those as in the previously described embodiments, the same designation numbers are used for ease of reference. In this embodiment, a single mask is used to pattern a photoresist layer 610 in contrast to the two-mask system described above. An implant 615 is then conducted to concurrently implant the isolation tubs 218 and the isolation region 230, after which the collector 226 is implanted. Since the isolation tubs 218 and isolation region 230 are concurrently implanted, their depths (as respectively measured from the top of the semiconductor substrate 216 to the peak dopant concentration of each structure) is substantially the same. In one embodiment, the implant may include implanting phosphorous with a dosage ranging from about 4E12 atoms/cm$^2$ to about 2E13 atoms/cm$^2$ and at an implant energy ranging from about 2 MeV to about 4.0 MeV. Generally, the energy that is chosen may be tool dependent but should be sufficient to drive the isolation region 230 and isolation tubs 218 deep enough such that there is enough separation between the collector 226 and the isolation region 230 to achieve a reduction in capacitance.

As seen from FIG. 6, a distance 620 separates the peak dopant concentration of the collector 226 from the peak dopant concentration of the isolation region 230. In one embodiment, distance 620 may range from about 0.9 microns to about 1.8 microns. In concurrently implanting the isolation region 230 and the isolation tub 218, the implant depth or implant dosages or both may need adjusting. The adjustment insures that there is sufficient overlap of the doping profiles to achieve electrical connectivity between the N tub 214, the isolation tub 218, and the isolation region 230, while still achieving the desired reduction in capacitance. Those who are skilled in the art would understand how to achieve this.

Figure 7:
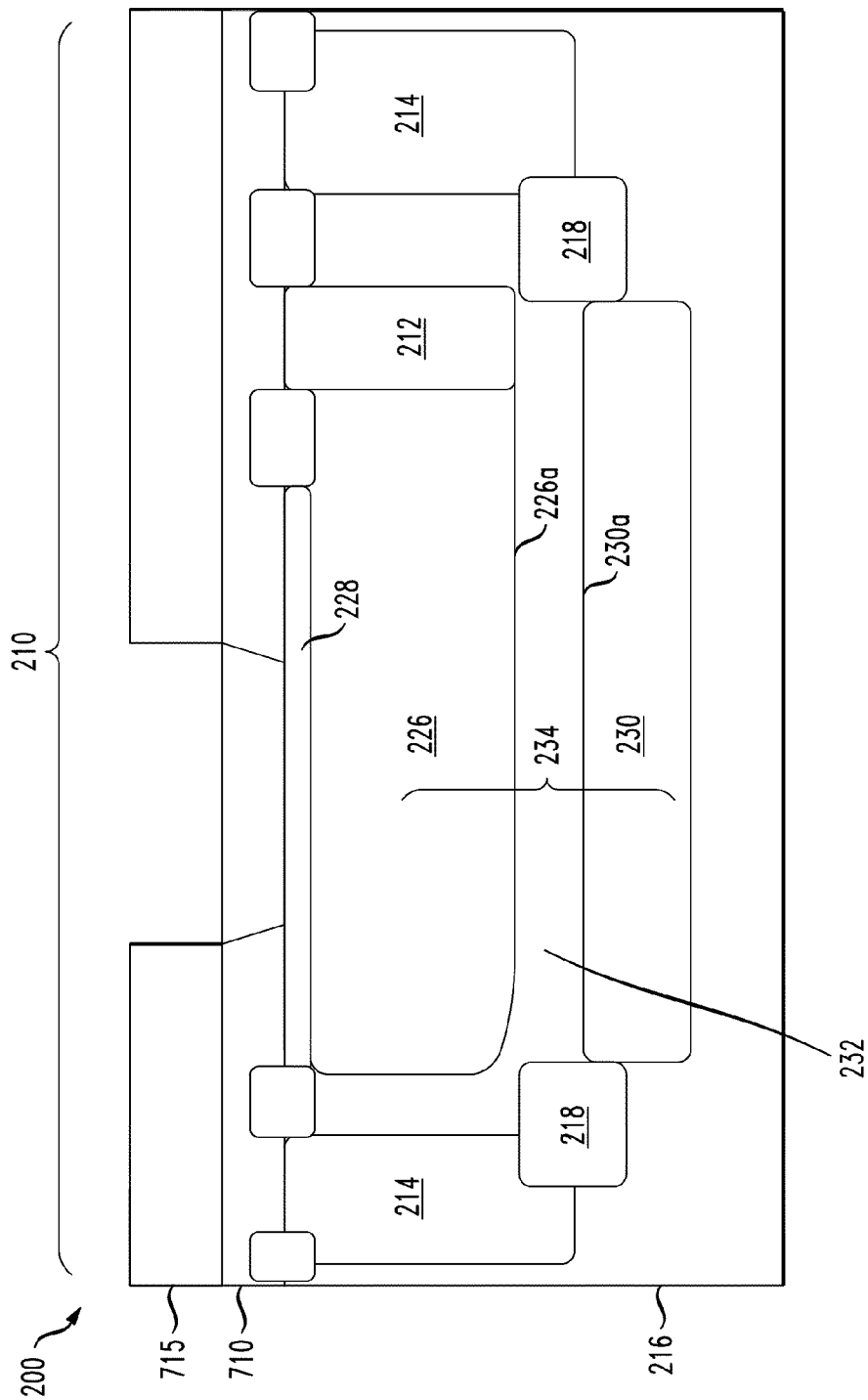
FIGS. 7-9 illustrate subsequent steps illustrating the completion of the formation of the bipolar transistor of the embodiment illustrated in FIG. 4.

In FIG. 7, which is the embodiment illustrated in FIG. 4, following the collector implant, conventional processes may be used to complete the fabrication of the semiconductor device 200. For example, a conventional base implant may used to form the base 228 in the collector 226. After the base 228 is formed, a spacer oxide deposition may be conducted to form oxide spacers over gate electrodes when present in the non-bipolar regions of the semiconductor device 200. The oxide spacer deposition also results in an oxide layer 710 located over the bipolar region 210.

Following the oxide spacer deposition step, a mask 715 is deposited over the bipolar region 210 and non-bipolar region, when present, and an etch is conducted through the oxide layer 715 to expose the top surface of the semiconductor substrate 216 and the base 228 and form an emitter opening, as shown.

Figure 8:
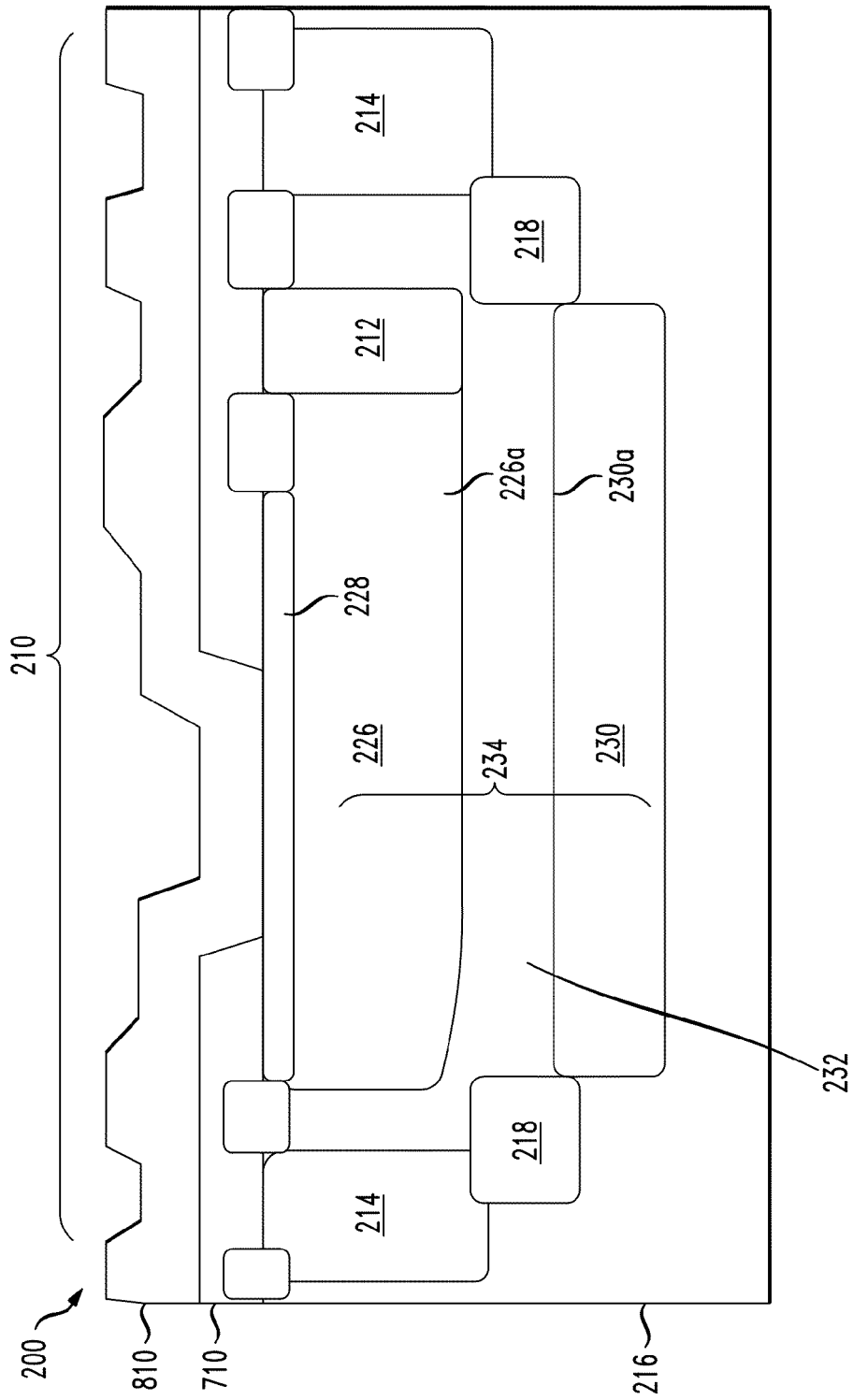
Figure 9:
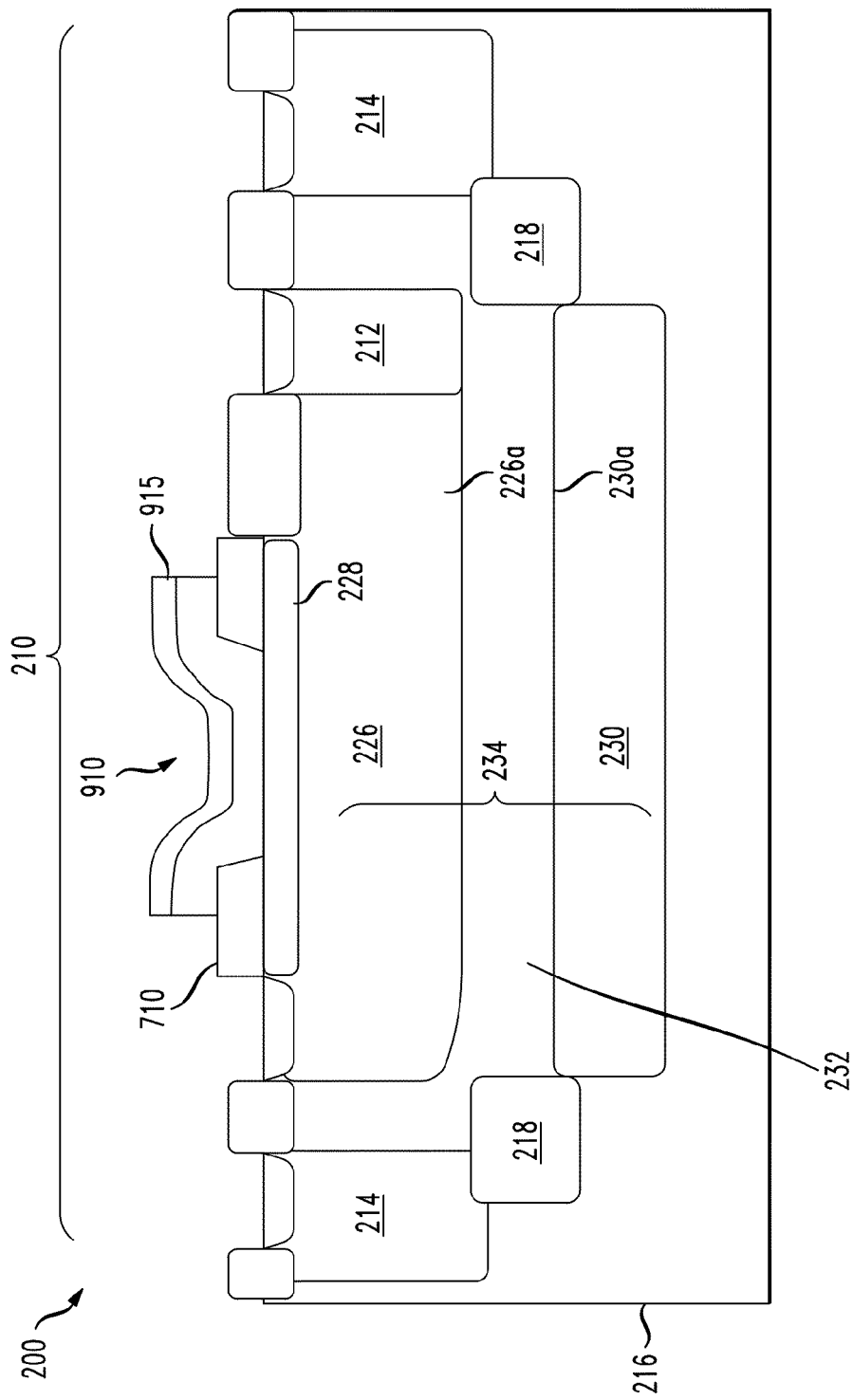

Mask 715 is removed and a base poly stack layer 810 is then formed, as shown in FIG. 8. Standard emitter deposition, emitter etch, base poly etches and contact implants may be conducted to arrive at the embodiment shown in FIG. 9, which includes emitter 915. It should be noted that the doping schemes may vary, depending on design, and those who are skilled in the art would understand how to implement such doping schemes to achieve an operable device. Other standard or conventional process may also be conducted subsequent to the emitter etch to complete the non-bipolar transistors when present and arrive at the device illustrated in FIG. 1.

Although the present invention has been described in detail, those skilled in the art should understand that they can make various changes, substitutions and alterations herein without departing from the spirit and scope of the invention in its broadest form.

What is claimed is:

1. A semiconductor device, comprising:
a collector located in a semiconductor layer having a peak dopant concentration, wherein the semiconductor layer is one of either a doped region in a silicon wafer, or an epitaxial layer;
a base located in the collector and adjacent an upper surface of the semiconductor layer; and
an isolation region located within the semiconductor layer and under the collector and having a peak dopant concentration, wherein the peak dopant concentration of the isolation region is separated from the peak dopant concentration of the collector by a distance that ranges from about 0.9 microns to about 2.0 microns.

2. The device recited in claim 1, wherein the distance is about 1.4 microns.

3. The device recited in claim 1, wherein the peak dopant concentration of the collector is about 1E19 atoms/$cm^3$ and the peak dopant concentration of the isolation region ranges from about 2E17 atoms/$cm^3$ to about 5E17 atoms/$cm^3$.

4. The device recited in claim 1, further including contact isolation tubs located adjacent the collector and isolation tubs located below the contact isolation tubs, wherein doping profiles of the contact isolation tubs and the isolation tubs overlap.

5. The device recited in claim 4, wherein a depth of the isolation region is greater than a depth of the isolation tubs.

6. The device recited in claim 4, wherein a depth of the isolation tubs and the isolation region is substantially the same.

7. The device recited in claim 4, wherein the collector is a collector for a vertical bipolar transistor that includes a base and an emitter includes and the device is an integrated circuit that comprises:
a plurality of the vertical bipolar transistors;
a plurality of non-bipolar transistors;
dielectric layers located over the non-bipolar transistors and vertical bipolar transistors; and
interconnects located in the dielectric layers that electrically connect the non-bipolar and vertical bipolar transistors.

8. The device recited in claim 1, wherein the peak dopant concentration of the collector occurs at a depth about 0.8 microns as measured from the surface of the substrate.

* * * * *